(12) United States Patent
Choi

(10) Patent No.: US 9,312,190 B2
(45) Date of Patent: Apr. 12, 2016

(54) SEMICONDUCTOR DEVICE AND METHOD OF MANUFACTURING THE SAME

(71) Applicants: SK hynix Inc., Icheon (KR); Industry-University Cooperation Foundation Hanyang University, Seoul (KR)

(72) Inventor: Chang-Hwan Choi, Seoul (KR)

(73) Assignees: SK HYNIX INC., Icheon (KR); INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 0 days.

(21) Appl. No.: 14/866,822

(22) Filed: Sep. 25, 2015

(65) Prior Publication Data

US 2016/0020151 A1 Jan. 21, 2016

Related U.S. Application Data

(62) Division of application No. 14/662,167, filed on Mar. 18, 2015, now Pat. No. 9,177,869, which is a division of application No. 13/931,079, filed on Jun. 28, 2013, now Pat. No. 9,013,000.

(30) Foreign Application Priority Data

Jun. 29, 2012 (KR) .................. 10-2012-0070913

(51) Int. Cl.
  *H01L 21/3205* (2006.01)
  *H01L 21/8238* (2006.01)
  *H01L 21/28* (2006.01)

(52) U.S. Cl.
  CPC .. *H01L 21/823842* (2013.01); *H01L 21/28008* (2013.01)

(58) Field of Classification Search
  CPC .................. H01L 21/823842; H01L 21/28008
  USPC ......................................................... 438/592
  See application file for complete search history.

(56) References Cited

U.S. PATENT DOCUMENTS

| | | | | |
|---|---|---|---|---|
| 8,766,379 B2* | 7/2014 | Liu | ................... | H01L 21/28079 257/324 |
| 2011/0062524 A1* | 3/2011 | Lin | ................... | H01L 21/28088 257/369 |
| 2011/0140207 A1* | 6/2011 | Lin | ................... | H01L 21/28088 257/412 |
| 2012/0238088 A1* | 9/2012 | Xiang | ............. | H01L 21/823842 438/592 |
| 2012/0256276 A1* | 10/2012 | Hwang | ........... | H01L 21/823842 257/410 |
| 2013/0234252 A1* | 9/2013 | Lee | ................. | H01L 21/823807 257/368 |

FOREIGN PATENT DOCUMENTS

KR  10-0463239 B1  12/2004

* cited by examiner

Primary Examiner — Douglas Menz

(57) ABSTRACT

The present disclosure relates to a semiconductor device and a method of manufacturing the same. The semiconductor device may include a first metal gate electrode provided in a NMOS region of a substrate; and a second metal gate electrode provided in a PMOS region of the substrate, wherein the first and second metal gate electrodes may be formed of TiN material or TiAlN material. Here, the first metal gate electrode may have a higher titanium (Ti) content than the second metal gate electrode, and the second metal gate electrode may have a higher nitrogen (N) content than the first metal gate electrode.

8 Claims, 11 Drawing Sheets

SEMICONDUCTOR DEVICE AND METHOD OF MANUFACTURING THE SAME

CROSS-REFERENCE TO RELATED APPLICATION

This application is a divisional of U.S. patent application Ser. No. 14/662, 167 filed on Mar. 18, 2015, which is a divisional of U.S. patent application Ser. No. 13/931,079 filed on Jun. 28, 2013, which claims the benefit under 35 U.S.C. §119 of Korean Patent Application No. 10-2012-0070913, filed on Jun. 29, 2012 in the Korean Intellectual Property Office, the entireties of which are incorporated herein by reference.

BACKGROUND

1. Technical Field

The present invention relates to semiconductor devices, and more particularly, to a semiconductor device of a CMOS structure, which includes a dual-work function metal gate having work functions adjusted by controlling a composition of components such as nitrogen (N), aluminum (Al), and titanium (Ti) within a TiN electrode, and a method of manufacturing the same.

2. Description of the Related Art

In a semiconductor device, a silicon oxide layer ($SiO_2$) is generally used as a gate dielectric layer of memories and logics. However, reduction in design rule of semiconductor devices results in increase in gate leakage current, causing a limit of the silicon oxide layer.

Reduction in tunneling current is obtained by increasing the thickness of the gate dielectric layer and a high permittivity (high-k) dielectric material is suggested as a solution to this. In addition, various studies have been made to minimize depletion of polysilicon through application of metal gate electrodes instead of polysilicon gate electrodes.

To obtain symmetrical and low threshold voltages in formation of a complementary metal-oxide semiconductor (CMOS), a technology using two metals having ideal work functions of an NMOS and a PMOS is suggested, but has a problem of causing etching failure of a metal electrode.

In particular, metals such as Ru, Mo, Pt, and the like, which can be used for an electrode of a PMOS and have high work functions, are not suited to a gate first process due to etching difficulty and low thermal stability. Thus, it is advantageous to use TiN in formation of a CMOS device, since TiN allows easy etching. However, it has been reported that TiN has an insufficient work function to be used for nMOSFETs and pMOSFETs.

Korean Patent Registration No 10-0463239 (Registration Date: Nov. 30, 2004) discloses a method of manufacturing a CMOS device having a dual-metal gate electrode. The dual-metal gate electrode of the CMOS device includes a first metal gate electrode, which is formed on an nMOS region and comprised of a material selected from among $Ru_{1-x}Ta_xN_y$, $WA_x$ (A=Ti, Ta, Nb) and $Ru_{1-x}C_xO_y$ (C=Ti, Ta), and a second metal gate electrode, which is formed on a pMOS region and selected from among $Ru_{1-x}Ti_xN_y$, $WB_x$(Ni, Mo, Pt) and $Ru_{1-x}D_xO_y$(D=Ni, Mo).

BRIEF SUMMARY

Therefore, embodiments of the present invention may aim at providing a semiconductor device of a CMOS structure including a dual-work function gate, which provides low threshold voltages both in an nMOSFET and a pMOSFET through adjustment of work functions of TiN electrodes or TiAlN electrodes by controlling contents of nitrogen (N), aluminum (Al), and titanium (Ti).

Further, embodiments may be aimed at providing a method of manufacturing a semiconductor device, which employs two different gate metals in formation of a CMOS structure to prevent failure in metal etching.

In accordance with one embodiment of the present invention, a semiconductor device includes: a first metal gate electrode provided in a NMOS region of a substrate; and a second metal gate electrode provided in a PMOS region of the substrate, wherein the first and second metal gate electrodes are formed of TiN material, wherein the first metal gate electrode has a higher titanium (Ti) content than the second metal gate electrode, and the second metal gate electrode has a higher nitrogen (N) content than the first metal gate electrode.

In accordance with another embodiment of the present invention, a semiconductor device includes: a first metal gate electrode provided in a NMOS region of a substrate; and a second metal gate electrode provided in a PMOS region of the substrate, wherein the first and second metal gate electrodes are formed of TiAlN material, wherein the first metal gate electrode has a higher titanium (Ti) content than the second metal gate electrode, and the second metal gate electrode has a higher nitrogen (N) content than the first metal gate electrode.

In accordance with a further embodiment of the present invention, a method of manufacturing a semiconductor device includes: forming an N-rich TiN layer in a PMOS region of a substrate; forming a Ti-rich TiN layer over the N-rich TiN layer and in a NMOS region of the substrate; and forming a first metal gate electrode in the NMOS region and a second metal gate electrode in the PMOS region by patterning the Ti-rich TiN layer in the NMOS region and a stack structure of the N-rich TiN layer and the Ti-rich TiN layer in the PMOS region.

In accordance with yet another embodiment of the present invention, a method of manufacturing a semiconductor device includes: forming a Ti-rich TiN layer in a NMOS region of a substrate; forming an N-rich TiN layer over the Ti-rich TiN layer and in a PMOS region of the substrate; and forming a first metal gate electrode in the NMOS region and a second metal gate electrode in the PMOS region by patterning a stack structure of the Ti-rich TiN layer and the N-rich TiN layer in the NMOS region and the Ni-rich TiN layer in the PMOS region.

In accordance with yet another embodiment of the present invention, a method of manufacturing a semiconductor device includes: forming a first TiN layer in a PMOS region of a substrate; forming an Al thin film over the first TiN layer and in a NMOS region of the substrate; forming a second TiN layer over the Al thin film; forming each of a first and a second TiAlN layers in the NMOS region and the PMOS region by annealing the substrate on which the second TiN layer is formed; and forming a first metal gate electrode in the NMOS region and a second metal gate electrode in the PMOS region by patterning the first and the second TiAlN layers, wherein the first TiAlN layer and the second TiAlN layer have a different composition.

According to embodiments of the present invention, the semiconductor device is formed with a dual-work function gate, which has work functions of an NMOS and a PMOS, through adjustment of the N, Al and Ti contents within a TiN electrode such that both nMOSPET and pMOSFET have low threshold voltages, thereby realizing a high performance CMOS device.

In the method of manufacturing the semiconductor device according to an embodiment of the present invention, a Ti-rich TiN layer for an nMOSFET and an N-rich TiN layer for a pMOSFET are formed through adjustment of the N and Ti contents in the TiN electrode, whereby an electrode having two metal work functions for a CMOSFET can be formed of a single material, that is, TiN, advantageous for metal etching, thereby preventing etching failure of metal electrodes in formation of a CMOS device.

In addition, a Ti-rich TiN layer for an nMOSFET and an N-rich TiN layer for a pMOSFET are formed on an in-situ Al thin film, which is thicker on the NMOS region than on the PMOS region, by forming in-situ TiN layers to prevent oxidation of the Al thin film, followed by annealing, whereby an electrode having two metal work functions for a CMOSFET can be formed of a single material, that is, TiAlN, advantageous for metal etching, thereby preventing etching failure of metal electrodes in formation of a CMOS device and achieving equivalent oxide thickness (EOT) scaling and greater shift of the flat band voltage ($V_{FB}$) than an existing CMOS process using $Al_2O_3$ capping.

Furthermore, since the TiN electrode or the TiAlN electrode is obtained through adjustment of the N, Al and Ti contents, a CMOS process is possible through a gate first process, which is generally used in the art, instead of a gate last process.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
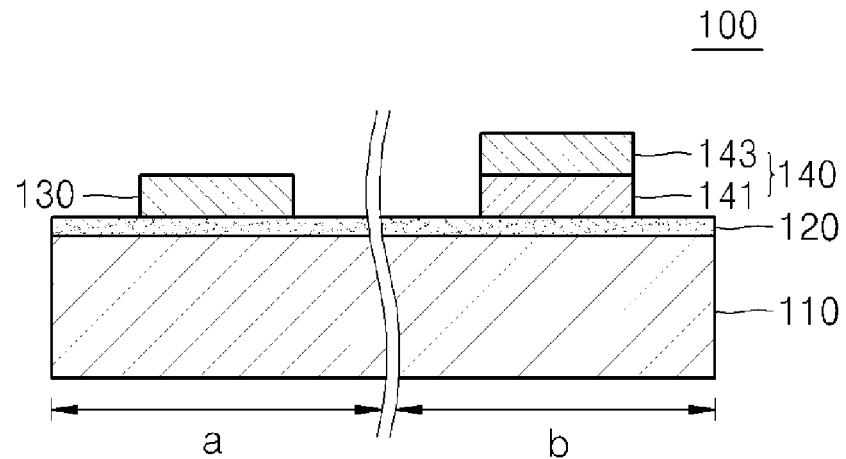
FIG. 1 is a sectional view of a semiconductor device in accordance with a first embodiment of the present invention.

Exemplary embodiments of the invention will now be described in detail with reference to the accompanying drawings. It should be understood that the present invention is not limited to the following embodiments and may be embodied in different ways, and that the embodiments are given to provide complete disclosure and a thorough understanding of the present invention to those skilled in the art. The scope of the present invention is defined only by the claims. The same components will be denoted by the same reference numerals throughout the specification.

FIG. 1 is a sectional view of a semiconductor device in accordance with a first embodiment of the present invention.

Referring to FIG. 1, a semiconductor device 100 includes a substrate 110, a gate insulation layer 120, a first metal gate electrode 130, and a second metal gate electrode 140.

The substrate 110 is defined by a first region (a) and a second region (b). The first region (a) refers to an n-channel metal oxide semiconductor (NMOS) region and the second region (b) refers to a p-channel metal oxide semiconductor (PMOS) region. The first region (a) and the second region (b) are isolated from each other by a field oxide layer (not shown) or a shallow trench isolation layer (STI, not shown).

The substrate 110 may be a typical semiconductor substrate. By way of example, the substrate 110 may be a p-type substrate doped with a low density of p-type impurities or an n-type substrate doped with a low density of n-type impurities. Alternatively, the substrate 110 may be a bulk Si substrate, silicon-on-insulator (SOI) substrate, and other substrates.

Although not shown in the drawings, a P-well is formed in the first region (a) of the substrate 110 and an N-well is formed in the second region (b) of the substrate 110.

The gate insulation layer 120 is formed on the first region (a) and the second region (b) of the substrate 110. As shown in the figures, the gate insulation layer 120 may be formed on an overall upper surface of the substrate 110 including the first region (a) and the second region (b). Although not shown in the drawings, the gate insulation layer 120 may be formed on a portion of each of the first and second regions (a) and (b) of the substrate 110.

Such the gate insulation layer 120 may be formed of a high-k dielectric material having a dielectric constant of 3.0 or more. For examples, the high permittivity (high-k) dielectric material may be selected among hafnium oxide, hafnium silicon oxide, hafnium silicon oxynitride, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, lead zinc niobate, etc.

When the gate insulation layer 120 is formed of the high permittivity (high-k) dielectric material, it is possible to be formed thicker than when it is formed of a silicon oxide layer ($SiO_2$). That is, a relatively thin high-k dielectric layer may be equivalent to a relatively thick silicon oxide layer in terms of electrical properties. Hereinafter, this electrical characteristic will be referred to as an 'equivalent oxide layer thickness' (EOT). Thus, with a thin gate insulation layer, a tunneling effect can be effectively prevented, thereby reducing current leakage.

The first metal gate electrode 130 is formed over the gate insulation layer 120 of the first region (a), i.e., the NMOS region, and the second metal gate electrode 140 is formed, with a higher thickness than the first metal gate electrode 130, over the gate insulation layer 120 of the second region (b), i.e., the PMOS region.

Here, the first and the second metal gate electrodes 130, 140 are each formed of single titanium nitride TiN material but may have different compositions. Specifically, the first metal gate electrode 130 is formed of a Ti-rich TiN layer, the Ti content of which is higher than the N content, that is a Ti-rich TiN layer.

On the contrary, the second metal gate electrode 140 has a stack structure of an N-rich TiN layer 141 and a Ti-rich TiN layer 143. The N-rich TiN layer 141 is a TiN layer where the N content is relatively higher than the Ti content. Compared to the first metal gate electrode 130, the second metal gate electrode 140 further includes the N-rich TiN layer.

In the first and the second metal gate electrodes 130, 140, the work functions of the TiN electrodes are adjusted according to the N and Ti contents, such that the second metal gate electrode 140 having a higher N content than the first metal gate electrode 130 has a higher work function than the first metal gate electrode 130.

Here, the first metal gate electrode 130 may have a work function of about 4.0 eV to about 4.3 eV, and the second metal gate electrode 140 may have a work function of about 4.8 eV to about 5.2 eV. Thus, the semiconductor device 100 has a dual-work function metal gate, in which the first metal gate electrode 130 and the second metal gate electrode 140 have different work functions, and both of an nMOSFET and a pMOSFET have a low threshold voltage of about 0.3V to about 0.6V.

Meanwhile, each of the first metal gate electrode 130 and the N-rich and the Ti-rich TiN layers 141, 143 of the second metal gate electrode 140 may have substantially the same thickness, for example, a thickness of about several dozens of nanometers, in some embodiments about 10 nm. If the first metal gate electrode 130 and the N-rich and the Ti-rich TiN layers 141, 143 of the second metal gate electrode 140 are excessively thin, there can be a problem of deterioration in gate characteristics.

Although not shown in the drawings, a first source and a first drain are formed in the first region (a) of the substrate 110 by implanting a high density of n-type impurities into the substrate 110 at both sides of the first metal gate electrode 130, respectively. Here, a region of the substrate 110 between the first source and the first drain is an n-channel. Further, a second source and a second drain are formed in the second region (b) of the substrate 110 by implanting a high density of p-type impurities into the substrate 110 at both sides of the second metal gate electrode 140, respectively. Here, a region of the substrate 110 between the second source and the second drain is a p-channel.

As a result, an nMOSFET, which includes the first source/first drain having a high density of n-type impurities, the gate insulation layer 120 and the first metal gate electrode 130 formed of the Ti-rich TiN layer, is formed in the first region (a). Further, a pMOSFET, which includes the second source/second drain having a high density of p-type impurities, the gate insulation layer 120 and the second metal gate electrode 140 formed N-rich TiN layer in the second region (b). With the nMOSFET and the pMOSFET, the semiconductor device 100 has a CMOS structure.

Figure 2:
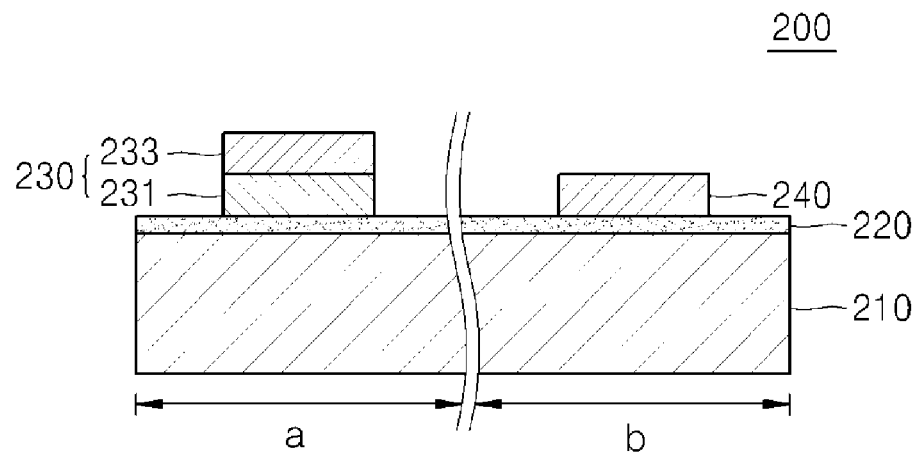
FIG. 2 is a sectional view of a semiconductor device in accordance with a second embodiment of the present invention.

FIG. 2 is a sectional view of a semiconductor device in accordance with a second embodiment of the present invention.

Referring to FIG. 2, a semiconductor device 200 includes a substrate 210, a gate insulation layer 220, a first metal gate electrode 230, and a second metal gate electrode 240.

Here, each of the first and the second metal gate electrodes 230, 240 are formed of TiN material but may have different compositions. Here, the first metal gate electrode 230 has a stack structure of a Ti-rich TiN layer 231 and an N-rich TiN layer 233. The first metal gate electrode 230 is formed of a Ti-rich TiN layer, which has a higher Ti content than that the second metal gate electrode 240. On the other hand, the second metal gate electrode 240 has a lower thickness than the first metal gate electrode 230 and is formed of a single N-rich TiN layer.

In the first and second metal gate electrodes 230, 240, the work functions of the TiN electrodes are adjusted according to the N and Ti contents, such that the second metal gate electrode 240 having a higher N content than the first metal gate electrode 230 has a higher work function than the first metal gate electrode 230. In other words, the first metal gate electrode 230 has a work function of about 4.0 eV to about 4.3 eV, and the second metal gate electrode 240 has a work function of about 4.8 eV to about 5.2 eV.

Accordingly, the semiconductor device 200 is formed with a dual-work function metal gate, in which the first metal gate electrode 230 and the second metal gate electrode 240 have different work functions and both of an nMOSFET and a pMOSFET have low threshold voltages of about 0.3V to about 0.6V.

Further, each of the Ti-rich TiN layer 231 and the N-rich TiN layer 233 of the first metal gate electrode 230 and the second metal gate electrode 240 may have substantially the same thickness, for example, a thickness of about several dozens of nanometers, preferably about 10 nm.

As a result, an nMOSFET, which includes a first source/a first drain (not shown) having a high density of n-type impurities, the gate insulation layer 220 and the first metal gate electrode 230 formed of the Ti-rich TiN layer, is formed in the first region (a). Further, a pMOSFET, which includes a second source/a second drain (not shown) having a high density of p-type impurities, the gate insulation layer 220 and the second metal gate electrode 240 formed of the N-rich TiN layer, is formed in the second region (b). With the nMOSFET and the pMOSFET, the semiconductor device 200 has a CMOS structure.

Except for these features, the materials and other components of the substrate 210 and the gate insulation layer 220 are the same as those of the substrate 110 and the gate insulation layer 120 described above, and repeated descriptions thereof will be omitted.

Generally, in a CMOS process, the nMOSFET requires a negative flat band voltage ($V_{FB}$) shift and the pMOSFET requires a positive flat band voltage ($V_{FB}$) shift.

Figure 3:
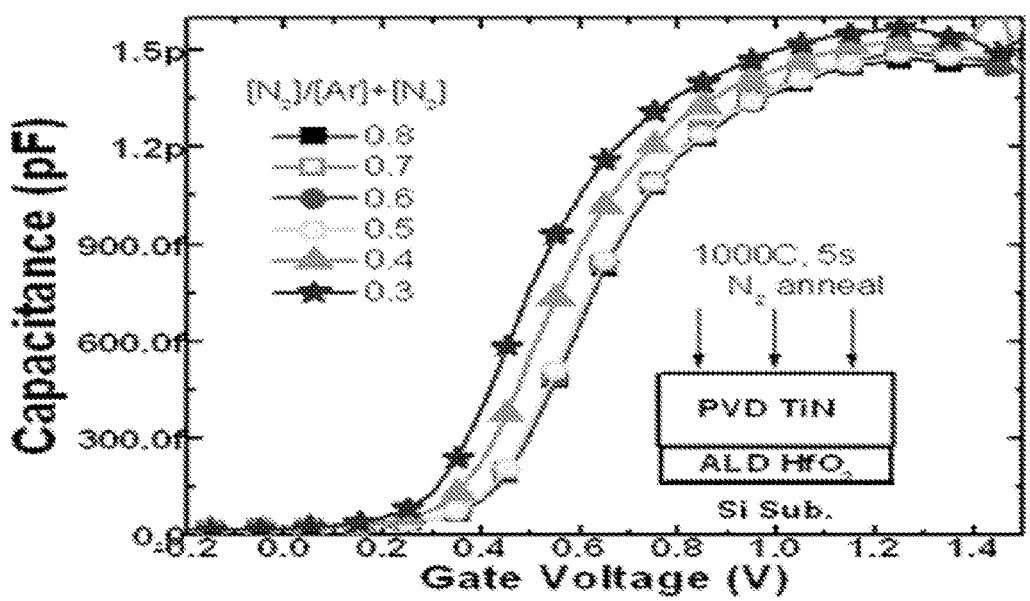
FIG. 3 is a graph depicting capacitance characteristics depending on gate voltage according to the N content within a TiN electrode.
Figure 4:
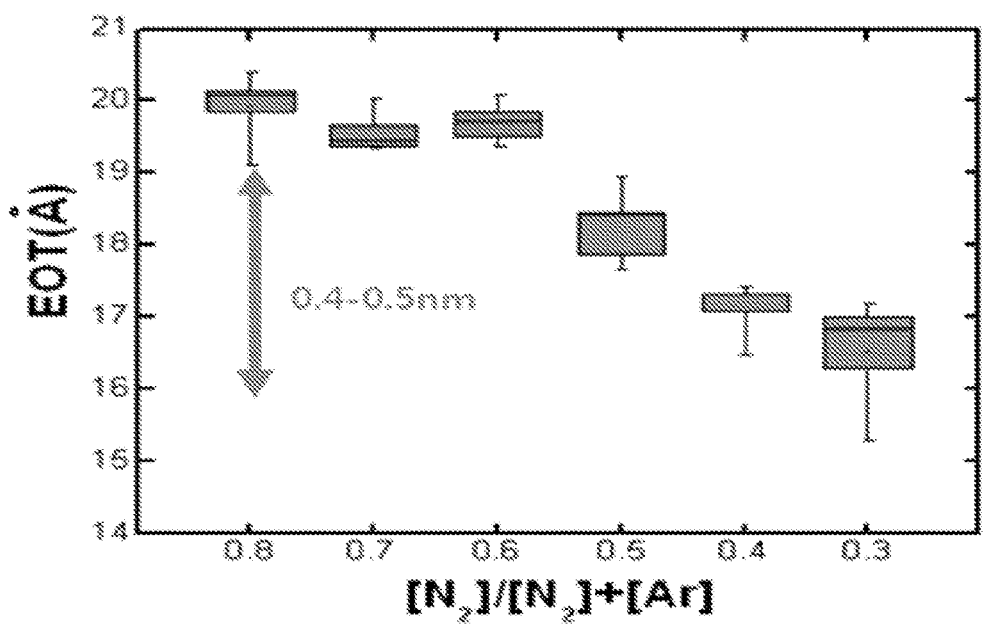
FIG. 4 is a graph depicting equivalent oxide layer thickness (EOT) according to the N content within the TiN electrode.
Figure 5:
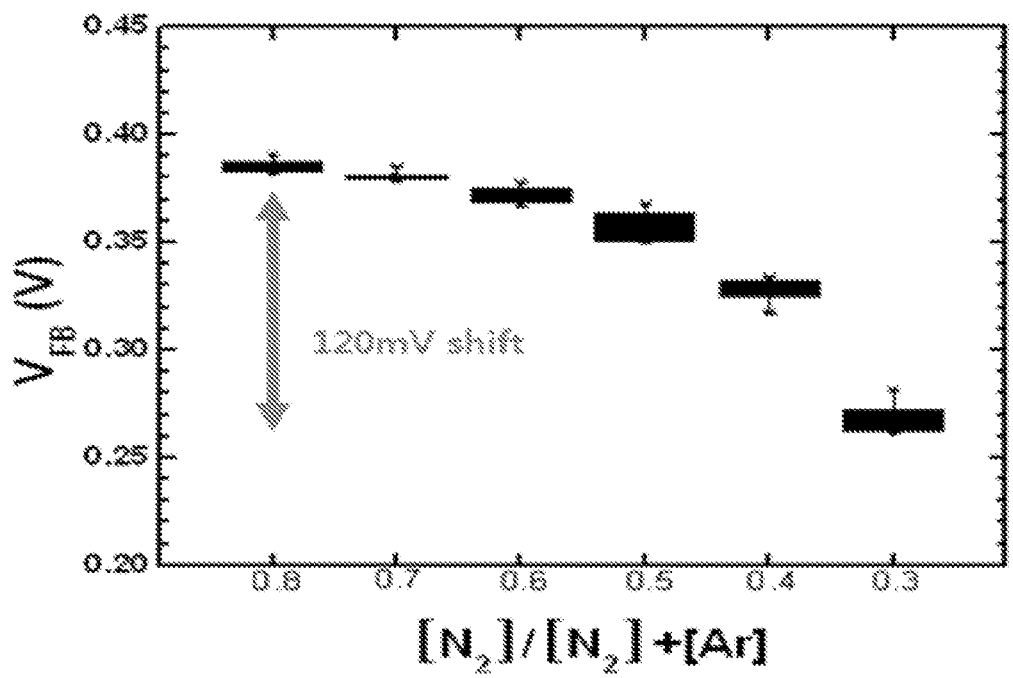
FIG. 5 is a graph depicting flat band voltage ($V_{FB}$) according to the N content within the TiN electrode.

In the first and the second embodiments, the first metal gate electrodes 130, 230 for the nMOSFET are formed of the Ti-rich TiN layer, which exhibits the negative flat band voltage ($V_{FB}$) shift, by relatively increasing the Ti content (or by relatively decreasing the N content), and the second metal gate electrodes 140, 240 for the pMOSFET are formed of the N-rich TiN layer which exhibits the positive flat band voltage ($V_{FB}$) shift, by relatively increasing the N content, whereby a dual-work function gate having an ideal work function for the NMOS and the PMOS can be formed, as can be seen from FIG. 3 to FIG. 5 described below.

As described above, the semiconductor devices 100, 200 according to the first and the second embodiments may realize high performance CMOS devices operated at low voltage or by low power by adjusting the work function of the gate TiN electrode in each of the nMOSFET and pMOSFET regions by controlling N and Ti contents within the TiN electrode such that both the nMOSFET and the pMOSFET have a low threshold voltage.

FIG. 3 is a graph depicting capacitance characteristics depending on gate voltage according to the N content within a TiN electrode, FIG. 4 is a graph depicting equivalent oxide layer thickness (EOT) according to the N content within the TiN electrode, and FIG. 5 is a graph depicting flat band voltage ($V_{FB}$) according to the N content within the TiN electrode.

A stack structure of an $HfO_2$ layer and a TiN layer was formed on a Si substrate. Here, the $HfO_2$ layer was formed through atomic layer deposition (ALD) and the TiN layer was formed through physical vapor deposition (PVD) in an argon Ar and nitrogen $N_2$ atmosphere. Then, the stack was subjected to annealing at 1000° C. for 5 seconds in a nitrogen $N_2$ atmosphere to fabricate a MOS device. Then, capacitance, EOT and flat band voltage ($V_{FB}$) of the MOS device were measured according to gate voltage with respect to TiN layers having $N_2$ partial fraction of 0.3, 0.4, 0.5, 0.6, 0.7 and 0.8. The $N_2$ partial fraction is defined as $[N_2]/[Ar]+[N_2]$. Results are shown in FIG. 3 to FIG. 5.

Referring to FIG. 3 to FIG. 5, it can be seen that, as the $N_2$ partial fraction is lowered, that is, as the Ti content increases to form a Ti-rich TiN layer in the TiN electrode, a negative flat band voltage ($V_{FB}$) shift property improved and equivalent oxide layer thickness (EOT) reduced.

Here, the equivalent oxide layer thickness (EOT) can be reduced by 0.4~0.5 nm by adjusting the N content within the TiN electrode.

In particular, when the N content within the TiN electrode was low, a negative flat band voltage ($V_{FB}$) shift suited for the metal gate of the nMOSFET was obtained. On the other hand, when the Ti content within the TiN electrode was high, a positive flat band voltage ($V_{FB}$) shift suited for the pMOSFET was obtained.

In this way, it was proven that a flat band voltage ($V_{FB}$) shift of about 120 mV can be obtained only by adjusting the N content within the TiN electrode.

Figure 6:
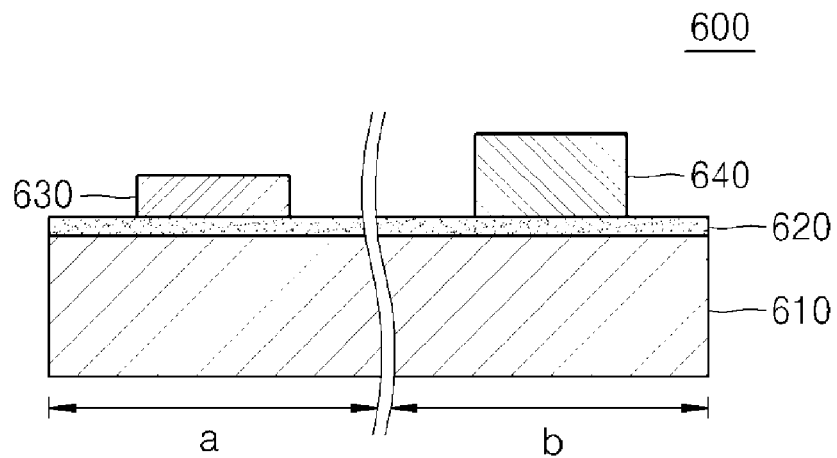
FIG. 6 is a sectional view of a semiconductor device in accordance with a third embodiment of the present invention.

FIG. 6 is a sectional view of a semiconductor device in accordance with a third embodiment of the present invention.

Referring to FIG. 6, a semiconductor device 600 includes a substrate 610, a gate insulation layer 620, a first metal gate electrode 630, and a second metal gate electrode 640.

In this embodiment, the first metal gate electrode 630 is formed on the gate insulation layer 620 of the first region (a) corresponding to an NMOS region, and the second metal gate electrode 640 is formed on the gate insulation layer 620 of a second region (b) corresponding to a PMOS region and has a higher thickness than the first metal gate electrode 630.

The first and the second metal gate electrodes 630, 640 according to the third embodiment may be formed of single layers of titanium aluminum nitride (TiAlN) material, but with different compositions.

Here, the first metal gate electrode 630 is formed of an Al/Ti-rich TiAlN layer, the Al and Ti contents of which are higher than those of the second metal gate electrode 640.

On the other hand, the second metal gate electrode 640 is formed of an N-rich TiAlN layer, the N content of which is higher than that of the first metal gate electrode 630.

Figure 7:
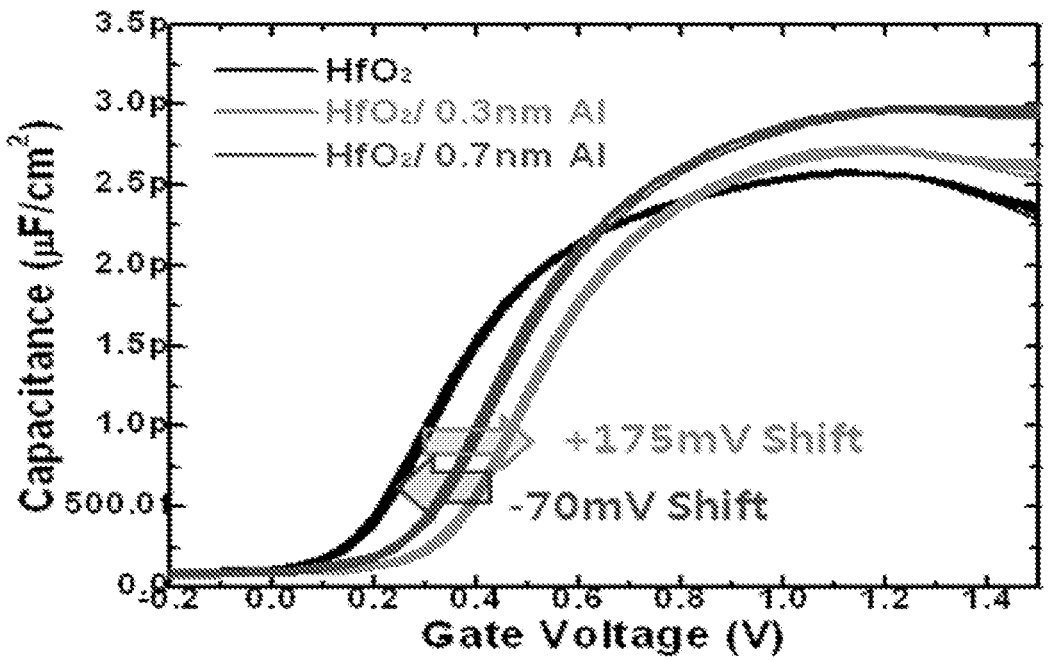
FIG. 7 is a graph depicting capacitance characteristics depending on gate voltage according to a thickness of an Al thin film formed on a high permittivity gate insulation layer.

In each of the first and the second metal gate electrodes 630, 640, the work function of the TiAlN metal electrode varies depending on the N, Al and Ti contents. In particular, as shown in FIG. 7, the TiAlN layers are different in EOT characteristics and flat band voltage ($V_{FB}$) shift. This difference is caused due to mechanisms of dipole formation and oxygen scavenging according to the Al content. Thus, the TiAlN layer can be formed into a TiAlN-based dual-work function gate having two work functions. In other words, this result means that the Al/Ti-rich TiAlN layer may be used as a metal electrode for an nMOSFET and the N-rich TiAlN layer may be used as a metal electrode for a pMOSFET.

In this case, the second metal gate electrode 640 having a higher N content than the first metal gate electrode 630 has a higher work function than the first metal gate electrode 630. The first metal gate electrode 630 may have a work function of about 4.0 eV to about 4.3 eV, and the second metal gate electrode 640 may have a work function of about 4.8 eV to about 5.2 eV.

Accordingly, the semiconductor device 600 is formed with a dual-work function metal gate, in which the first metal gate electrode 630 and the second metal gate electrode 640 have different work functions, and both the nMOSFET and the pMOSFET have a low threshold voltage of about 0.3V to about 0.6V.

As a result, an nMOSFET, which includes a first source/a first drain (not shown) having a high density of n-type impurities, the gate insulation layer 620 and the first metal gate electrode 630 formed of the Al/Ti-rich TiAlN layer, is formed on the first region (a). Further, a pMOSFET, which includes a second source/a second drain (not shown) having a high density of p-type impurities, the gate insulation layer 620 and the second metal gate electrode 640 formed of the N-rich TiN layer, is formed on the second region (b). With the nMOSFET and the pMOSFET, the semiconductor device 600 has a CMOS structure.

Except for these features, the materials and other components of the substrate 610 and the gate insulation layer 620 are the same as those of the substrate 110 and the gate insulation layer 120 of the first embodiment, and thus, repeated descriptions thereof will be omitted herein.

FIG. 7 is a graph depicting capacitance characteristics depending on gate voltage according to a thickness of an Al thin film formed on a high permittivity gate insulation layer.

In FIG. 7, capacitance depending on gate voltage was measured according to the thickness of an Al thin film using CMOS devices, which have in-situ Al thin films formed to thicknesses of 0 nm, 0.3 nm and 0.7 nm on a high permittivity gate insulation layer of $HfO_2$, respectively.

As shown in FIG. 7, when the Al thin film had a thickness of 0.3 nm, dipole formation was superior, thereby providing a positive flat band voltage ($V_{FB}$) shift of about 175 mV, which is advantageous for the pMOSFET, compared with the Al thin film having a thickness of 0 nm.

When the Al thin film had a thickness of 0.7 nm, interfacial layer scavenging was superior, thereby providing a negative flat band voltage ($V_{FB}$) shift of about 70 mV, compared with the Al thin film having a thickness of 0.3 nm. The Al thin film may be formed through in-situ process after the gate insulation layer of $HfO_2$ is formed, thereby controlling EOT scaling.

As a result, it can be ascertained that variation in composition through thickness adjustment of the Al thin film may be employed for the metal gate of the CMOS device.

A conventional process of forming an aluminum oxide ($Al_2O_3$) layer on a high-k material layer for changing the threshold voltage of the pMOSFET provides a small flat band voltage ($V_{FB}$) shift and difficulty in EOT scaling.

However, according to the third embodiment, the work function of the TiAlN electrode for the gate is adjusted through adjustment of the flat band voltage ($V_{FB}$) shift and EOT scaling by controlling the Al content together with the N and Ti contents within the TiN electrode. Accordingly, a low threshold voltage may be achieved both in the nMOSFET and the pMOSFET, thereby realizing a high performance CMOS device suited for low voltage or low power operation.

FIGS. 8 to 11 are sectional views illustrating a method of manufacturing the semiconductor device in accordance with the first embodiment of the present invention, for example, the semiconductor device of FIG. 1.

Figure 8:
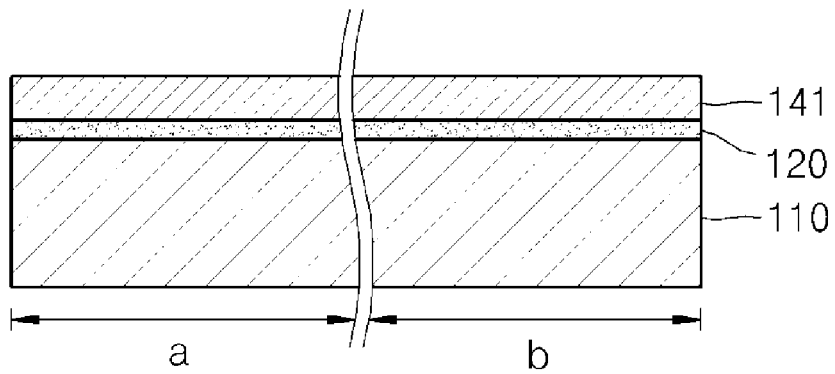
FIGS. 8 to 11 are sectional views illustrating a method of manufacturing a semiconductor device in accordance with the first embodiment of the present invention.

Referring to FIG. 8, a substrate 110 having a gate insulation layer 120 is prepared, and a N-rich TiN layer 141 in which the N content is higher than the Ti content, is formed over an entire upper surface of the gate insulation layer 120. The N-rich TiN layer 141 may be formed to a thickness of several dozens of nanometers, for example about 10 nm, by typical physical vapor deposition (PVD) such that the N content is higher than the Ti content therein. In this case, nitrogen ($N_2$) may be used as a reaction gas and argon (Ar) may be used as a discharge gas.

The substrate 110 is defined as a first region (a) and a second region (b), which correspond to an NMOS region and a PMOS region, respectively.

The gate insulation layer 120 may be formed of a high-k dielectric material having a dielectric constant of 3.0 or more in the first region (a) and the second region (b) of the substrate 110 through chemical vapor deposition (CVD), atomic layer deposition (ALD), and the like. Although not shown in the drawings, the gate insulation layer 120 may be partially formed in a line type on a portion of the substrate in the first region (a) and a portion of the substrate in the second region (b) by patterning through a typical photolithography process.

The substrate 110 may be a p-type substrate doped with a low density of p-type impurities, an n-type substrate doped with a low density of n-type impurities, a bulk Si substrate, a silicon-on-insulator (SOI) substrate, or other substrates. Alternatively, a substrate having a P-well formed in the first region (a) and an N-well formed in the second region (b) may be prepared as the substrate 110. Alternatively, the P-well and the N-well may be directly formed in the first region (a) and the second region (b), respectively.

Figure 9:
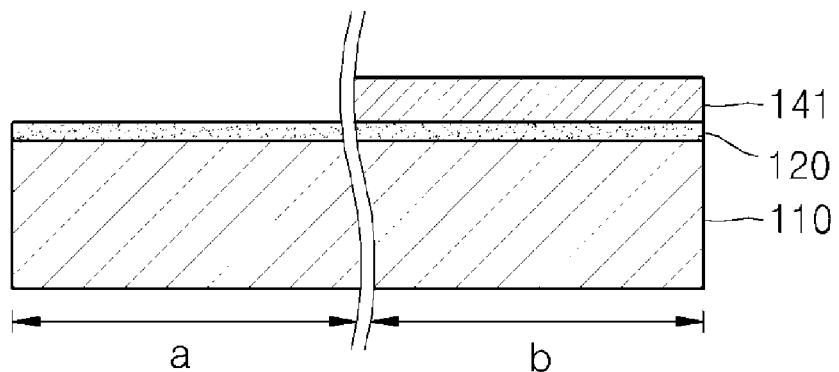

Then, referring to FIG. 9, the N-rich TiN layer 141 (FIG. 8) formed on the gate insulation layer 120 of the first region (a) is subjected to selective etching.

For selective etching, either dry etching or wet etching, known in the art, may be performed. By way of example, after forming a photoresist pattern (not shown) on the N-rich TiN layer 141 of the second region (b) so as to expose the N-rich TiN layer 141 (FIG. 8) in the first region (a), the exposed N-rich TiN layer (FIG. 8) in the first region (a) may be subjected to selective etching using the photoresist pattern as a mask. As a result, the N-rich TiN layer 141 remains only on the gate insulation layer 120 in the second region (b).

Figure 10:
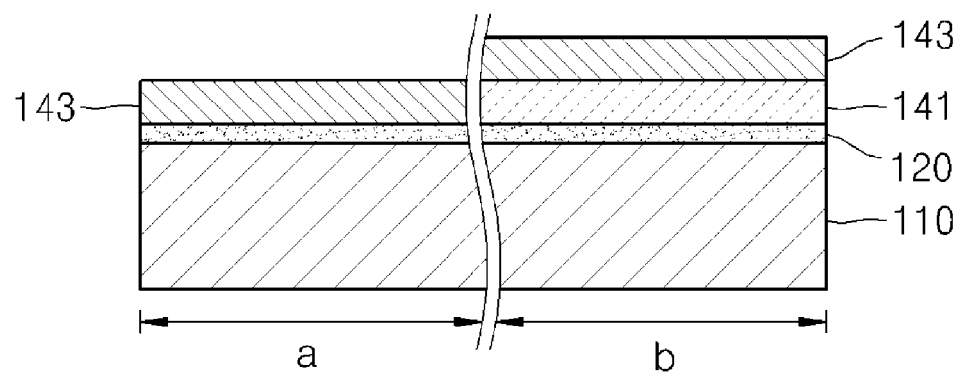

Referring to FIG. 10 a Ti-rich TiN layer 143, a Ti content of which is higher than a N content, is formed on the remaining N-rich TiN layer 141 and the exposed portion of the gate insulation layer 120. The Ti-rich TiN layer 143 may be formed to a thickness of several dozens of nanometers, preferably about 10 nm, by typical physical vapor deposition (PVD). The Ti content of the Ti-rich TiN layer 143 is higher than the N content therein. In this case, nitrogen ($N_2$) may be used as a reaction gas and argon (Ar) may be used as a discharge gas.

Figure 11:
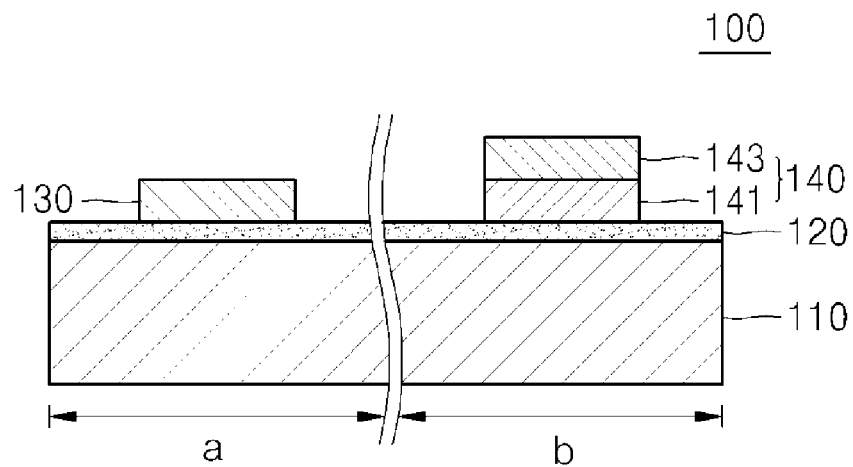

In an alternative embodiment, the Ti content of the Ti-rich TiN layer 143 is not necessarily higher than the Ti content of the Ti-rich TiN layer 143 so long as the Ti content of the Ti-rich TiN layer 143 is higher than the Ti content of the N-rich TiN layer 141. Referring to FIG. 11, the Ti-rich TiN layer 143 (FIG. 10) in the first region (a) and a stack structure of the N-rich TiN layer 141 (FIG. 10) and Ti-rich TiN layer 143 (FIG. 10) in the second region (b) are subjected to patterning to form a first metal gate electrode 130 on the gate insulation layer 120 of the first region (a) and a second metal gate electrode 140 having the stack structure of the N-rich TiN layer 141 and the Ti-rich TiN layer 143 on the gate insulation layer 120 of the second region (b).

At this time, the first metal gate electrode 130 is formed of the Ti-rich TiN layer, and the second metal gate electrode 140 formed the N-rich TiN layer, the N content of which is higher than the Ti content, as compared with the first metal gate electrode 130.

The work functions of the TiN electrodes may be adjusted according to the N and Ti contents. In this case, the second metal gate electrode 140 having a higher N content than the first metal gate electrode 130 has a higher work function than the first metal gate electrode 130.

The first metal gate electrode 130 may have a work function of about 4.0 eV to about 4.3 eV and the second metal gate electrode 140 may have a work function of about 4.8 eV to about 5.2 eV. Thus, the semiconductor device 100 has a CMOS structure of a dual-work function metal gate, in which the first metal gate electrode 130 and the second metal gate electrode 140 have different work functions in the NMOS and PMOS regions, respectively.

A patterning process for forming the first and the second metal gate electrodes 130, 140 may be performed using a typical gate patterning process. For example, after forming first and second photosensitive patterns (not shown) in a line type over the substrate 110 in the first and second regions (a) and (b) to expose portions of the Ti-rich TiN layer 143 (FIG. 10) respectively, the exposed portion of the Ti-rich TiN layer 143 (FIG. 10) of the first region (a) and the exposed portion of the stack structure of the N-rich TiN layer 141 (FIG. 10) and the Ti-rich TiN layer 143 (FIG. 10) of the second region (b) may be subjected to etching using the first and the second photoresist patterns as a mask to form the first and the second metal gate electrodes 130, 140.

Meanwhile, although not shown in the drawings, after forming the first and the second metal gate electrodes 130, 140, a first source and a first drain are formed in the first region (a) of the substrate 110 by implanting a high density of n-type impurities into the substrate 110 at both sides of the first metal gate electrode 130 through ion implantation, respectively, and a second source and a second drain are formed over the substrate 110 in the second region (b) by implanting a high density of p-type impurities into the substrate 110 at both sides of the second metal gate electrode 140 through ion implantation, respectively, thereby forming an nMOSPET in the first region (a) and a pMOSFET in the second region (b).

As such, in the method of manufacturing the semiconductor device according to the first embodiment, the Ti-rich TiN layer for the nMOSFET and the N-rich TiN layer for the pMOSFET are formed through adjustment of the N and Ti contents within the TiN electrode, whereby a dual-work function metal electrode for a CMOSFET is formed of a TiN material which is advantageous for etching, thereby preventing etching failure in the course of forming the metal electrodes for the CMOS structure.

Further, since TiN is used for the gate electrodes both for the nMOSFET and the pMOSFET, a typical CMOS process employing TiN as a gate electrode and forming a gate before a source/drain is formed is still applicable. In contrast, in another conventional method of employing (i) material other than TiN material or (i) non-TiN material and TiN material in combination, e.g., in a stack structure, the gate needs to be formed after the source/drain is formed and thus the typical CMOS process is required to be changed. In this regard, embodiments may be advantageous in using the typical and well-established conventional CMOS technology with any substantial change.

Furthermore, a dual-work function gate having ideal work functions of the NMOS and the PMOS can be easily formed by changing the work function of the TiN metal through adjustment of the N and Ti contents within the TiN electrode, whereby the semiconductor device 100 having a CMOS structure capable of realizing a low threshold voltage both in the nMOSFET and the pMOSFET can be easily manufactured.

FIGS. 12 to 15 are sectional views illustrating a method of manufacturing the semiconductor device in accordance with the second embodiment of the present invention, for example, the semiconductor device of FIG. 2.

Figure 12:
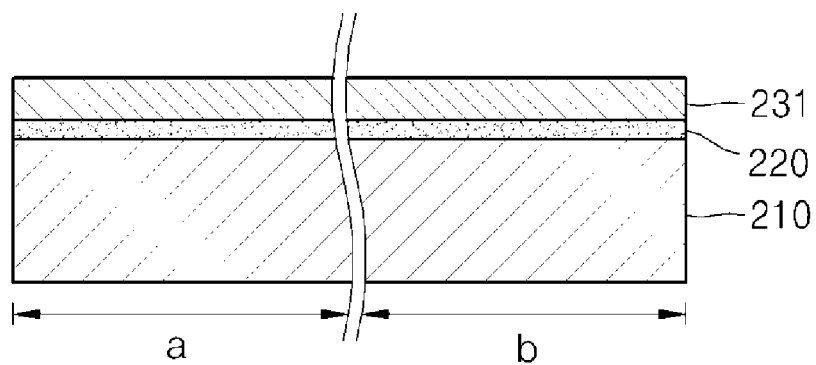
FIGS. 12 to 15 are sectional views illustrating a method of manufacturing a semiconductor device in accordance with the second embodiment of the present invention.

Referring to FIG. 12, a substrate 210 having a gate insulation layer 220 is prepared, and a TiN layer, the Ti content of which is higher than the N content, that is, a Ti-rich TiN layer 231, is formed over an upper surface of the gate insulation layer 220.

The Ti-rich TiN layer 231 may be formed to a thickness of several dozens of nanometers, preferably about 10 nm, by typical physical vapor deposition (PVD) such that the Ti content is higher than the N content. In this case, nitrogen ($N_2$) may be used as a reaction gas and argon (Ar) may be used as a discharge gas.

Except for these features, the materials and other features of the substrate 210 and the gate insulation layer 220 may be the same as those of the substrate 110 and the gate insulation layer 120 of FIG. 8, and thus, repeated descriptions thereof will be omitted herein.

Figure 13:
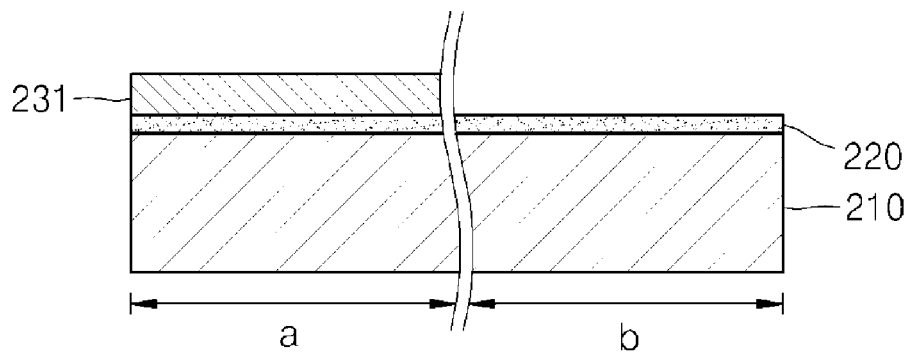

Referring to FIG. 13, the Ti-rich TiN layer 231 (FIG. 12) formed on the gate insulation layer 220 in the second region (b) is selectively etched.

For selective etching, either dry etching or wet etching, known in the art, may be performed. By way of example, after forming a photoresist pattern (not shown) on the Ti-rich TiN layer 231 of the first region (a) so as to expose the Ti-rich TiN layer 231 (FIG. 12) of the second region (b), the exposed portion of the Ti-rich TiN layer 231 (FIG. 12) of the second region (b) may be subjected to selective etching using the photoresist pattern as a mask. As a result, the Ti-rich TiN layer 231 remains only on the gate insulation layer 120 in the first region (a).

Figure 14:
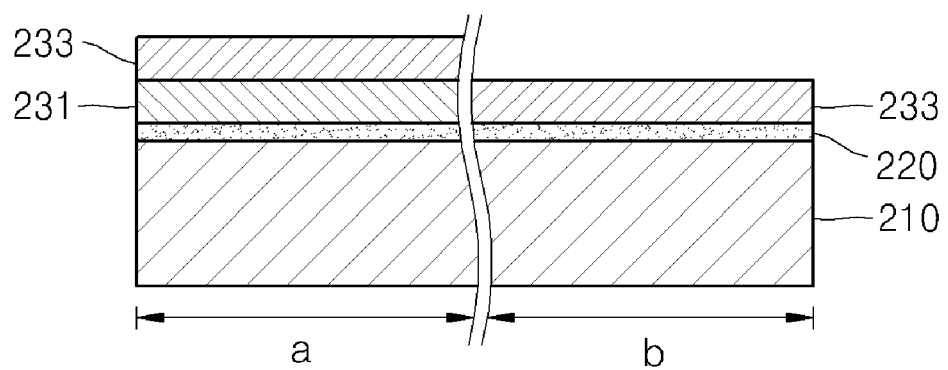

Referring to FIG. 14, a TiN layer, the N content of which is higher than the Ti content, that is, an N-rich TiN layer 233, is formed on the remaining Ti-rich TiN layer 231 and the exposed region of the gate insulation layer 220. The N-rich TiN layer 233 may be formed to a thickness of several dozens of nanometers, preferably about 10 nm, by typical physical vapor deposition (PVD) such that the N content is higher than the Ti content therein. In this case, nitrogen ($N_2$) may be used as a reaction gas and argon (Ar) may be used as a discharge gas.

Figure 15:
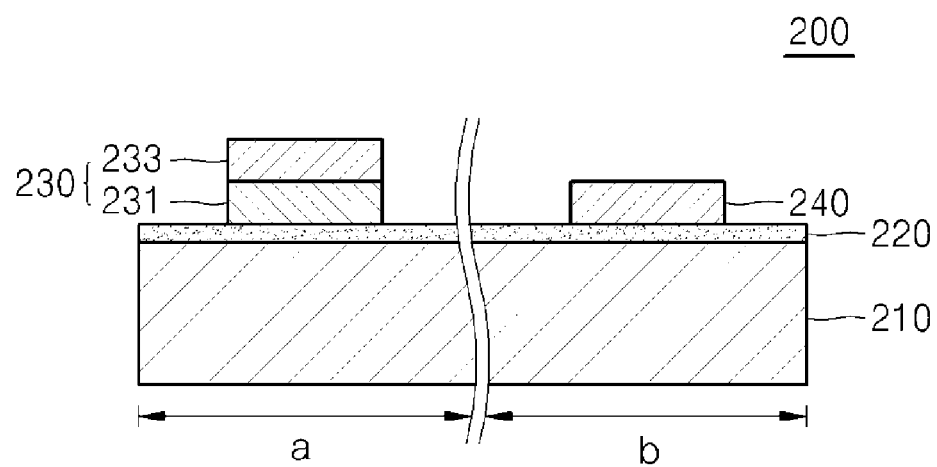

Referring to FIG. 15, a stack structure of the Ti-rich TiN layer 231 and the N-rich TiN layer 233 in the first region (a) and the N-rich TiN layer 233 (FIG. 14) in the second region (b) is subjected to patterning to form a first metal gate electrode 230 having the stack structure of the Ti-rich TiN layer 231 and N-rich TiN layer 233 on the gate insulation layer 220 in the first region (a), and a second metal gate electrode 240 comprised of the N-rich TiN layer 233 on the gate insulation layer 220 in the second region (b).

The first metal gate electrode 230 formed the Ti-rich TiN layer, the Ti content of which is higher than the N content, as compared with the second metal gate electrode 240, and the second metal gate electrode 240 is formed of the N-rich TiN layer.

The work function of the TiN electrode may be adjusted according to the N and Ti contents. In this case, the second metal gate electrode 240 having a higher N content than the first metal gate electrode 230 has a higher work function than the first metal gate electrode 230.

The first metal gate electrode 230 may have a work function of about 4.0 eV to about 4.3 eV and the second metal gate electrode 240 may have a work function of about 4.8 eV to about 5.2 eV. Thus, the semiconductor device 200 has a CMOS structure of a dual-work function metal gate, in which the first metal gate electrode 230 and the second metal gate electrode 240 have different work functions in the NMOS and the PMOS regions, respectively.

A patterning process for forming the first and the second metal gate electrodes 230, 240 may be performed using a typical gate patterning process. For example, after forming first and second photoresist patterns (not shown) in a line type in the first and second regions (a) and (b) to expose portions of the N-rich TiN layer 233 (FIG. 14), respectively, the exposed portion of the stack structure of the Ti-rich TiN layer 231 (FIG. 14) and the N-rich TiN layer 233 (FIG. 14) in the first region (a) and the exposed region of the N-rich TiN layer 233 (FIG. 14) in the second region (b) may be subjected to etching using the first and second photoresist patterns as a mask to form the first and the second metal gate electrodes 230, 240.

Meanwhile, although not shown in the drawings, after forming the first and the second metal gate electrodes 230, 240, a first source and a first drain are formed in the first region (a) of the substrate 210 by implanting a high density of n-type impurities into both sides of the first metal gate electrode 230 on the substrate 210 through ion implantation, respectively, and a second source and a second drain are formed in the second region (b) of the substrate 210 by implanting a high density of p-type impurities into both sides of the second metal gate electrode 240 on the substrate 210 through ion implantation, respectively, thereby forming an nMOSPET in the first region (a) and a pMOSFET in the second region (b).

As described above, the method of manufacturing the semiconductor device according to the second embodiment may prevent etching failure of the metal electrodes upon formation of the CMOS using a TiN material alone which is advantageous for etching, and may allow a convention CMOS process to be applicable.

FIGS. 16 to 22 are sectional views illustrating a method of manufacturing the semiconductor device in accordance with the third embodiment of the present invention, for example, the semiconductor device of FIG. 6.

Figure 16:
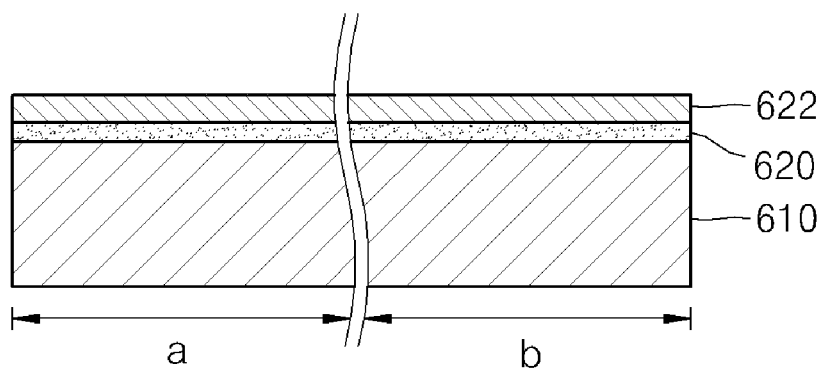
FIGS. 16 to 22 are sectional views illustrating a method of manufacturing a semiconductor device in accordance with the third embodiment of the present invention.

Referring to FIG. 16, a substrate 610 having a gate insulation layer 620 is prepared, and a first TiN layer 622 is formed over an upper surface of the gate insulation layer 620.

The first TiN layer 622 may be a TiN layer having a Ti to N ratio of 1:1, or may be an N-rich TiN layer. The first TiN layer 622 may be formed by typical physical vapor deposition (PVD). In this case, nitrogen ($N_2$) may be used as a reaction gas and argon (Ar) may be used as a discharge gas.

Except for these features, the materials and other features of the substrate 610 and the gate insulation layer 620 may be the same as those of the substrate 110 and the gate insulation layer 120 of FIG. 8, and thus, repeated descriptions thereof will be omitted herein.

Figure 17:
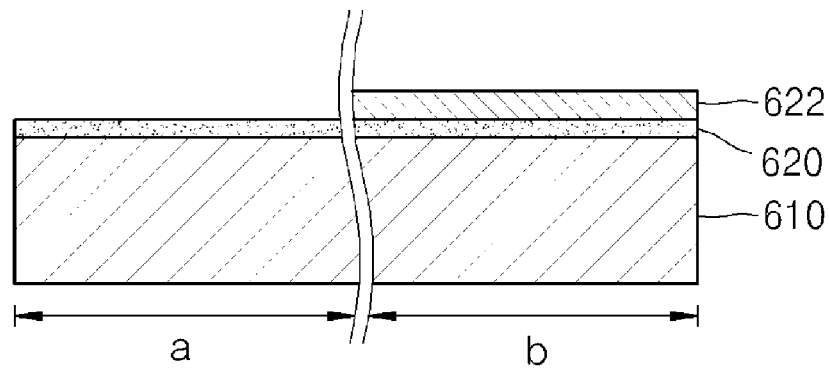

Referring to FIG. 17, the first TiN layer 622 (FIG. 16) formed on the gate insulation layer 620 in the first region (b) is selectively etched.

For selective etching, either dry etching or wet etching, known in the art, may be performed. By way of example, after forming a photoresist pattern (not shown) on the first TiN layer 622 in the second region (b) so as to expose the first TiN layer 622 (FIG. 16) of the first region (a), the exposed portion of the first TiN layer 622 (FIG. 16) of the first region (a) may be subjected to selective etching using the photoresist pattern as a mask. As a result, the first TiN layer 622 remains only on the gate insulation layer 620 in the second region (b).

Figure 18:
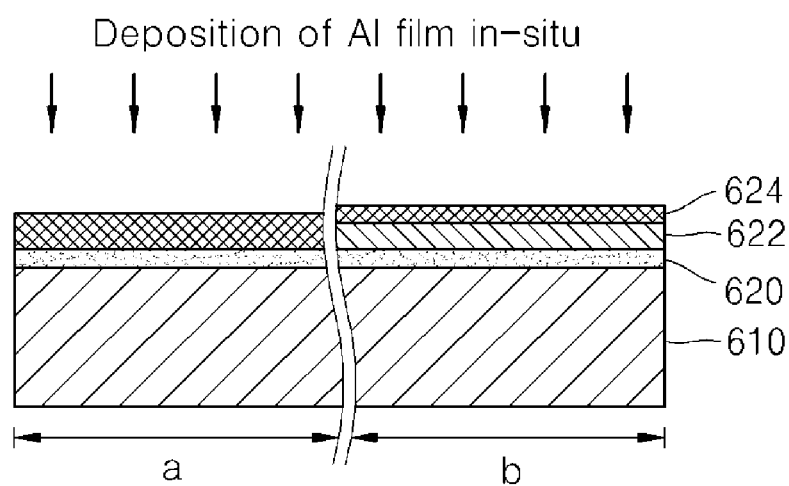

Referring to FIG. 18, an Al thin film 624 is formed on the remaining first TiN layer 622 on the gate insulation layer 620 in the second region (b) and the exposed portion of the gate insulation layer 620 in the first region (a).

To prevent oxidation of the Al, the Al thin film 624 may be formed in-situ without an air-break which is exposed to air or application of a partial pressure of air to the substrate 610 having the first TiN layer 622. Further, the Al thin film 624 may be thicker in the first region (a) than in the second region (a) in order to form TiAlN layers having different work functions in the first and the second regions (a) and (b) through adjustment of the Al content in the TiAlN layers by thickness adjustment thereof.

For this purpose, referring again to FIG. 7, the Al thin film 624 may be formed to a thickness of 0.5 nm to 10 nm by PVD or CVD.

If the thickness of the Al thin film 624 is less than 0.5 nm, dipole formation becomes superior, thereby providing a positive flat band voltage ($V_{FB}$) shift advantageous for the pMOSFET. However, it is difficult to obtain a desired threshold voltage in the nMOSFET.

If the thickness of the Al thin film 624 exceeds 10 nm, oxygen scavenging of a dielectric material of the gate insulation layer 620 and an interfacial oxide layer between the gate insulation layer 620 and the Al thin film 624 on the substrate 610 due to Al results in formation of oxygen vacancies within the gate insulation layer 620 or the interfacial oxide layer, thereby reducing a negative flat band voltage ($V_{FB}$) shift. As a result, an energy band diagram of the interfacial layer between the gate metal 624 and the gate dielectric material 620 is changed, so that the gate metal can lose properties as a P-type material. This can be proven by the fact that EOT reduction becomes facilitated with increasing a thickness of the Al thin film. That is, it can be considered that oxygen in the interfacial oxide having a low dielectric constant is trapped by Al.

Figure 19:
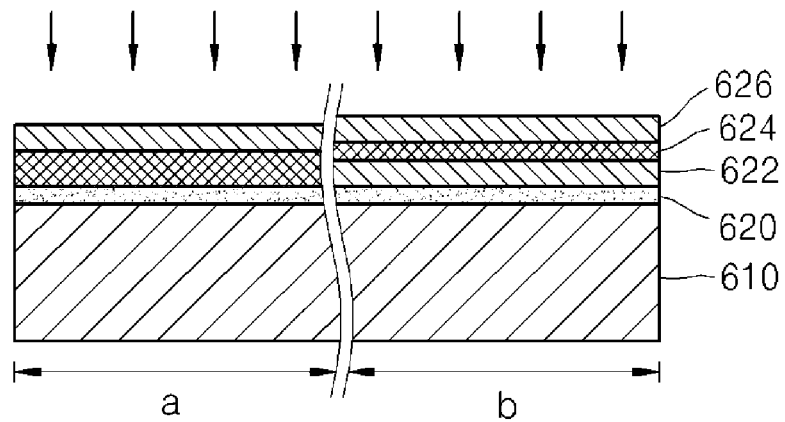

Referring to FIG. 19, a second TiN layer 626 is formed in situ on the Al thin film 624.

The second TiN layer 626 may be any of a TiN layer having a Ti to N ratio of 1:1, an N-rich TiN layer, and a Ti-rich TiN layer. The second TiN layer 626 may be formed by typical PVD. In this case, nitrogen ($N_2$) may be used as a reaction gas and argon (Ar) may be used as a discharge gas.

Particularly, when forming the second TiN layer 626 on the Al thin film 624, the second TiN layer 626 may be formed without an air-break. That is, the substrate 610 having the in-situ Al thin film 624 is not exposed to air or a partial pressure of air to prevent oxidation of the Al thin film 624 into Al oxide ($Al_2O_3$). In this case, it is possible to achieve a greater shift of the flat band voltage ($V_{FB}$) than in a conventional CMOS process using an $Al_2O_3$ capping layer.

Figure 20:
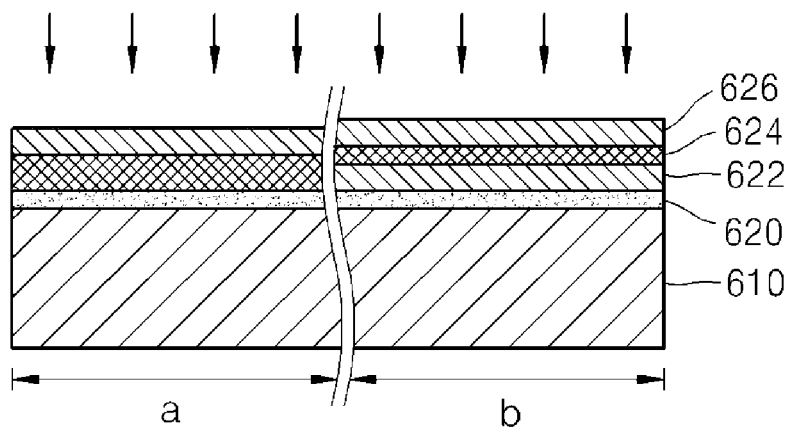
Figure 21:
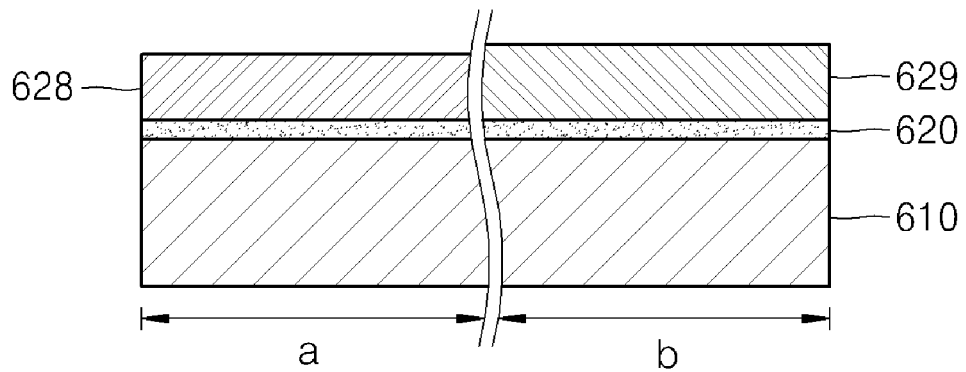

Referring to FIGS. 20 and 21, the substrate 610 having the second TiN layer 626 is subjected to annealing Annealing may be performed at 1000~1300° C. for 3 seconds to 1 minute in a nitrogen ($N_2$) atmosphere. If annealing is performed at a temperature of less than 1000° C., it is difficult to obtain a uniform film. If annealing is performed at a temperature higher than 1300° C., thermal stress can be applied to the metal electrode formed of the TiAlN layer. Post-annealing may be performed at a dopant activation temperature according to a typical CMOS process.

As a result, a stack structure of the Al thin film 624 and the second TiN layer 626 is uniformly formed on the gate insulation layer 620 in the first region (a) by annealing at high temperature, thereby forming a first TiAlN layer 628.

On the other hand, a stack structure of the first TiN layer 622, the Al thin film 624 and the second TiN layer 626 is uniformly formed on the gate insulation layer 620 of the second region (b), so that a second TiAlN layer 629 having a higher N content than the first TiAlN layer 628 is formed.

For example, the first TiAlN layer 628 is an Al/Ti-rich TiAlN layer, the Al and Ti contents of which are higher than those of the second TiAlN layer 629, and the second TiAlN layer 629 is an N-rich TiAlN layer, the N content of which is higher than that of the first TiAlN layer 628.

Figure 22:
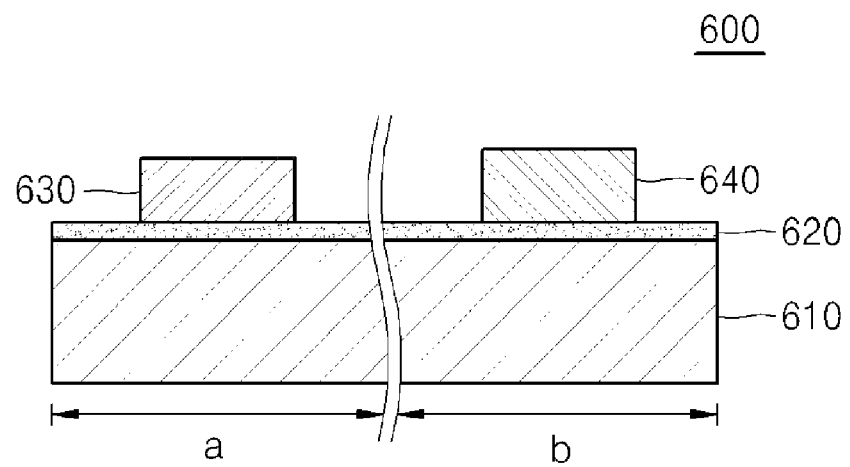

Referring to FIG. 22, a first metal gate electrode 630 is formed on the gate insulation layer 620 in the first region (a) and a second metal gate electrode 640 is formed on the gate insulation layer 620 in the second region (b) by patterning the first TiAlN layer 628 and the second TiAlN layer 629.

In the first and the second metal gate electrodes 630, 640, the work functions of the TiN electrodes may be adjusted according to the N, Al and Ti contents. In this case, the second metal gate electrode 640 having a higher N content than the first metal gate electrode 630 has a higher work function than the first metal gate electrode 630.

The first metal gate electrode 630 may have a work function of about 4.0 eV to about 4.3 eV and the second metal gate electrode 640 may have a work function of about 4.8 eV to about 5.2 eV. Thus, the semiconductor device 600 has a CMOS structure of a dual-work function metal gate, in which the first metal gate electrode 630 and the second metal gate electrode 640 have different work functions on the NMOS and PMOS regions, respectively.

A patterning process for forming the first and the second metal gate electrodes 630, 640 may be performed using a typical gate patterning process. For example, after forming first and second photoresist patterns (not shown) in a line type in the first and the second regions (a) and (b) to expose portions of the first TiAlN layer 628 and the second TiAlN layer 629, respectively, the exposed portions of the first TiAlN layer 628 and the second TiAlN layer 629 may be subjected to etching using the first and second photoresist patterns as a mask to form the first and the second metal gate electrodes 630, 640.

Meanwhile, although not shown in the drawings, after forming the first and the second metal gate electrodes 630, 640, a first source and a first drain are formed in the first region (a) of the substrate 610 by implanting a high density of n-type impurities into both sides of the first metal gate electrode 630 on the substrate 610 through ion implantation, respectively, and a second source and a second drain are formed in the second region (b) of the substrate 610 by implanting a high density of p-type impurities into both sides of the second metal gate electrode 640 on the substrate 610 through ion implantation, respectively, thereby forming an nMOSPET in the first region (a) and an pMOSFET in the second region (b).

As such, in the method of manufacturing the semiconductor device according to the third embodiment, the Ti-rich TiN layer for the nMOSFET and the N-rich TiN layer for the pMOSFET are formed through adjustment of the N, Al and Ti contents within the TiN electrode, whereby a dual-work function metal electrode for a CMOSFET is formed of a TiAlN material alone which is advantageous for etching, thereby preventing etching failure of the metal electrodes in formation of the CMOS while allowing a conventional CMOS process to be applicable.

Furthermore, a dual-work function gate having ideal work functions of the NMOS and the PMOS can be easily formed by changing the work function of the TiAlN metal through adjustment of the N, Al and Ti contents within the TiN electrode, whereby the semiconductor device 600 having a CMOS structure capable of realizing a low threshold voltage both in the nMOSFET and the pMOSFET can be easily manufactured.

Furthermore, according to this embodiment, the TiAlN layer is formed based on in-situ formation of the Al thin film 624 and the second TiN layer 626, thereby allowing EOT scaling to be performed and the flat band voltage ($V_{FB}$) shift to be greater than in a conventional process, which employs an $Al_2O_3$ dielectric material to change the flat band voltage ($V_{FB}$).

Although some exemplary embodiments have been described herein, it should be understood by those skilled in the art that these embodiments are given by way of illustration only, and that various modifications, variations and alterations can be made without departing from the spirit and scope of the present invention. Therefore, the scope of the present invention should be limited only by the accompanying claims and equivalents thereof.

What is claimed is:

1. A method of manufacturing a semiconductor device, comprising:
    forming a first TiN layer in a PMOS of a substrate;
    forming an Al thin film over the first TiN layer in the PMOS region and in a NMOS region of the substrate;
    forming a second TiN layer over the Al thin film;
    forming each of a first and a second TiAlN layers in the NMOS region and the PMOS region by annealing the substrate on which the second TiN layer is formed; and
    forming a first metal gate electrode in the NMOS region and a second metal gate electrode in the PMOS region by patterning the first and the second TiAlN layers,
    wherein the first TiAlN layer and the second TiAiN layer have a different composition.

2. The method according to claim 1,
    wherein the first metal gate electrode has a higher titanium (Ti) content than the second metal gate electrode, and
    wherein the second metal gate electrode has a higher nitrogen (N) content than the first metal gate electrode.

3. The method according to claim 1,
    wherein the Al thin film is thicker in the NMOS region than in the PMOS region.

4. The method according to claim 1,
    wherein the first TiN layer comprises a TiN layer or an N-rich TiN layer.

5. The method according to claim 1,
    wherein the second TiN layer comprises any of a TiN layer, an N-rich TiN layer, and a Ti-rich TiN layer.

6. The method according to claim 1,
    wherein the forming the Al thin film and the second TiN layer are performed in an in-situ process, and
    wherein the in-situ process is performed without an air-break in which the substrate is exposed to air or a partial pressure of air.

7. The method according to claim 1, wherein a work function of the second metal gate electrode is higher than a work function of the first metal gate electrode.

8. The method according to claim 1, further comprising:
    forming a gate insulation layer in the NMOS and the PMOS regions of the substrate before forming the first TiN layer in the PMOS region,
    wherein the gate insulation layer includes a high permittivity (high-k) dielectric material having a dielectric constant of about 3.0 or more.

* * * * *